(12) United States Patent
Song et al.

(10) Patent No.: US 11,107,750 B1
(45) Date of Patent: Aug. 31, 2021

(54) MAGNETOFLUID PUMP DEVICE FOR IGBT HEAT DISSIPATION AND TEST METHOD THEREFOR

(71) Applicant: DALIAN UNIVERSITY OF TECHNOLOGY, Liaoning (CN)

(72) Inventors: Xueguan Song, Liaoning (CN); Kunpeng Li, Liaoning (CN); Changan Zhou, Liaoning (CN); Chaoyong Zong, Liaoning (CN); Qingye Li, Liaoning (CN); Wei Sun, Liaoning (CN)

(73) Assignee: DALIAN UNIVERSITY OF TECHNOLOGY, Liaoning (CN)

( * ) Notice: Subject to any disclaimer, the term of this patent is extended or adjusted under 35 U.S.C. 154(b) by 0 days.

(21) Appl. No.: 17/252,649

(22) PCT Filed: Aug. 3, 2020

(86) PCT No.: PCT/CN2020/106578
§ 371 (c)(1),
(2) Date: Dec. 15, 2020

(87) PCT Pub. No.: WO2021/036700
PCT Pub. Date: Mar. 4, 2021

(30) Foreign Application Priority Data

Aug. 25, 2019 (CN) .......................... 201910787108.2

(51) Int. Cl.
*G01L 19/00* (2006.01)
*H01L 23/473* (2006.01)
(Continued)

(52) U.S. Cl.
CPC .............. *H01L 23/473* (2013.01); *G01J 5/00* (2013.01); *G01L 19/0092* (2013.01);
(Continued)

(58) Field of Classification Search
None
See application file for complete search history.

(56) References Cited

FOREIGN PATENT DOCUMENTS

| CN | 102426902 A | 4/2012 |
| CN | 109271008 A | 1/2019 |
| CN | 110534488 A | 12/2019 |

OTHER PUBLICATIONS

Office Action dated Aug. 28, 2020 issued in corresponding Chinese Application No. 201910787108.2 (with English translation).
(Continued)

*Primary Examiner* — Lisa M Caputo
*Assistant Examiner* — Nigel H Plumb
(74) *Attorney, Agent, or Firm* — Muncy, Geissler, Olds and Lowe, P.C.

(57) ABSTRACT

A magnetofluid pump device for IGBT heat dissipation and a test method therefor are provided. The magnetofluid pump device uses a liquid metal as a coolant, which can absorb more heat than an ordinary water-cooling device and better dissipate heat for IGBT chips. Temperature and pressure changes in an inlet pipe and an outlet pipe of a magnetofluid pump can be monitored in real time through temperature sensors and pressure sensors, and temperature changes of the IGBT chips can be observed in real time through a thermal imager. The test method for the magnetofluid pump device for IGBT heat dissipation proposed by the present invention is simple and easy to implement. A magnetic fluid can be driven to flow by energizing positive and negative electrodes in the magnetofluid pump under the action of magnetic fields, and water-cooling equipment can dissipate heat for the magnetic fluid in the magnetofluid pump.

6 Claims, 6 Drawing Sheets

(51) Int. Cl.
*G01J 5/00* (2006.01)
*H02K 11/25* (2016.01)
*H02K 44/04* (2006.01)

(52) U.S. Cl.
CPC ............. *H02K 11/25* (2016.01); *H02K 44/04* (2013.01); *G01J 2005/0077* (2013.01)

(56) References Cited

OTHER PUBLICATIONS

Decision to Grant a Patent dated Oct. 12, 2020 issued in corresponding Chinese Application No. 201910787108.2 (with English translation).
International Search Report and Written Opinion dated Nov. 10, 2020 issued in corresponding International Application No. PCT/CN2020/106578.

MAGNETOFLUID PUMP DEVICE FOR IGBT HEAT DISSIPATION AND TEST METHOD THEREFOR

TECHNICAL FIELD

The present invention belongs to the field related to IGBT heat dissipation, and relates to a magnetofluid pump device for IGBT heat dissipation and a test method therefor.

BACKGROUND

Related fields such as offshore wind power, submarine drilling and railways require highly reliable power conversion systems. IGBT is a core component of a power conversion system, and the service life thereof is crucial to the normal operation of the system. Most of the failures of power electronic equipment are caused by high temperature, and most of the existing cooling systems are based on water cooling. As the power density of power electronics technology continues to increase, redundant heat cannot be dissipated by water cooling technology. It is of great significance to find a new type of coolant with high thermal conductivity for heat dissipation. Liquid metals have better thermal conductivity than water and can absorb more heat, but currently very few cooling devices uses liquid metals as coolants.

Temperature is an important factor that affects the service life of an IGBT. How to use a liquid metal as a coolant to fully dissipate heat for the IGBT and keep the IGBT at a suitable operating temperature is of great significance. Therefore, it is necessary to invent a magnetofluid pump device for IGBT heat dissipation and a test method therefor.

SUMMARY

In view of the problems in the prior art, the present invention provides a magnetofluid pump device for IGBT heat dissipation and a test method therefor. The magnetofluid pump device for IGBT heat dissipation designed by the present invention absorbs more heat than a traditional water-cooling device, and has a better heat dissipation effect. The test method for the magnetofluid pump device for IGBT heat dissipation proposed by the present invention is simple in operation, can be used to well dissipate heat for an IGBT, and can be used to test the heat dissipation effect of a liquid metal at different flow rates on IGBT chips when the IGBT is at different temperatures.

To achieve the above purpose, the present invention adopts the following technical solution:

A magnetofluid pump device for IGBT heat dissipation, wherein the magnetofluid pump device is used to dissipate heat for a IGBT chipset; and the IGBT chipset comprises an IGBT chip A 8, an IGBT chip B 22, an IGBT chip C 24 and an IGBT bottom plate 23. The IGBT chip A 8, the IGBT chip B 22 and the IGBT chip C 24 are welded on the IGBT bottom plate 23 by tin solder, and the IGBT chipset is arranged on a magnetofluid pump. The magnetofluid pump device comprises the magnetofluid pump, a water-cooling device, pressure measuring devices, temperature measuring devices and a data acquisition system.

The magnetofluid pump comprises a magnetofluid pump upper shell 7, a magnetofluid pump lower shell 2, a magnetofluid pump pipe 3, a magnet S pole A 9, a magnet N pole A 10, a magnet S pole B 11, a magnet N pole B 12, a positive electrode A 18, a negative electrode A 19, a negative electrode B 39 and a positive electrode B 40. The magnet S pole A 9, the magnet N pole A 10, the magnet S pole B 11, the magnet N pole B 12, the positive electrode A 18, the negative electrode A 19, the negative electrode B 39 and the positive electrode B 40 are all embedded in the magnetofluid pump upper shell 7; the magnet S pole A 9, the magnet N pole A 10, the magnet S pole B 11 and the magnet N pole B 12 are arranged in order from left to right; the positive electrode A 18 and the negative electrode B 39 are located on the front face of the magnetofluid pump upper shell 7; and the negative electrode A 19 and the positive electrode B 40 are located on the back face of the magnetofluid pump upper shell 7. The magnetofluid pump lower shell 2 is connected with the water-cooling device by a magnetofluid pump water inlet pipe 1 and a magnetofluid pump water outlet pipe 16. The magnetofluid pump upper shell 7 is connected with the magnetofluid pump lower shell 2 by a connecting bolt A 6 and a connecting bolt B 13. A magnetic field is generated by the magnet S pole A 9 and the magnet N pole A 10, an electric field is generated by the positive electrode A 18 and the negative electrode A 19; a liquid metal is conductive and magnetic, and an upward Lorentz force will be generated under the co-action of the electric field and the magnetic field, so that the liquid metal will move upwards. Similarly, a downward Lorentz force will be generated under the action of a magnetic field generated by the magnet S pole B 11 and the magnet N pole B 12 and an electric field generated by the negative electrode B 39 and the positive electrode B 40, so that the liquid metal will move downwards.

An annular groove is formed between the IGBT bottom plate 23 and the magnetofluid pump upper shell 7, an annular seal ring 20 is arranged in the annular groove and used for sealing, and the IGBT bottom plate 23 and the magnetofluid pump upper shell 7 are connected by a connecting bolt C 21 and a connecting bolt D 25. The magnetofluid pump pipe 3 is connected with the magnetofluid pump upper shell 7 by threads. The magnetofluid pump water inlet pipe 1 is connected with the magnetofluid pump lower shell 2 by flanges and fastened by a connecting bolt E 26 and a connecting bolt F 27; the magnetofluid pump water outlet pipe 16 is connected with the magnetofluid pump lower shell 2 by flanges and fastened by a connecting bolt G 28 and a connecting bolt H 29; and connecting parts of the flanges are all provided with seal rings for end face sealing.

The water-cooling device is a piece of water-cooling equipment 17, which is connected with the magnetofluid pump water inlet pipe 1 and the magnetofluid pump water outlet pipe 16, and is used to dissipate heat for the liquid metal in the magnetofluid pump. Specifically: the magnetofluid pump water outlet pipe 16 is connected with the water-cooling equipment 17 by flanges, and two flanges are fastened by a connecting bolt I 30 and a connecting bolt J 31; the magnetofluid pump water inlet pipe 1 is also connected with the water-cooling equipment 17 by flanges, and two flanges are fastened by a connecting bolt K 32 and a connecting bolt L 33; and the connecting parts of the flanges are all provided with seal rings for end face sealing.

The pressure measuring devices are a pressure sensor A 4 and a pressure sensor B 14, which are arranged on the magnetofluid pump water inlet pipe 1 and the magnetofluid pump water outlet pipe 16, and are used to measure the pressure in the magnetofluid pump water inlet pipe 1 and the magnetofluid pump water outlet pipe 16. Specifically: the pressure sensor A 4 is connected with a pressure sensor A base 35 by threads, the pressure sensor A base 35 is connected with the magnetofluid pump water inlet pipe 1 by threads, and all connecting parts are provided with seal rings; and the installation method of the pressure sensor B 14 is the same.

The temperature measuring devices are a temperature sensor A 5, a temperature sensor B 15 and a thermal imager 36, which are arranged on the magnetofluid pump water inlet pipe 1, the magnetofluid pump water outlet pipe 16 and the IGBT chipset, and are used to measure the temperature of the magnetofluid pump water inlet pipe 1, the magnetofluid pump water outlet pipe 16 and the IGBT chipset. Specifically: the temperature sensor A 5 is connected with a temperature sensor A base 34 by threads, the temperature sensor A base 34 is connected with the magnetofluid pump water inlet pipe 1 by threads, and all connecting parts are provided with seal rings; and the installation method of the temperature sensor B 15 is the same. The thermal imager 36 is 30 cm away from the IGBT chip A 8, the IGBT chip B 22 and the IGBT chip C 24, and is used to measure the temperature changes of the chips.

The data acquisition system is an industrial personal computer 38, is used to control an external circuit to heat the IGBT chip A 8, the IGBT chip B 22 and the IGBT chip C 24 to a certain temperature and acquire the data information of the pressure sensor A 4, the pressure sensor B 14, the temperature sensor A 5, the temperature sensor B 15 and the thermal imager 36, and is electrically connected with each sensor.

A test method for the magnetofluid pump device for IGBT heat dissipation, comprising the following steps:

Step 1: starting the system, turning on the water-cooling equipment 17, and adjusting appropriate flow and pressure to dissipate heat for the magnetofluid pump; and acquiring the data information of the pressure sensor A 4, the pressure sensor B 14, the temperature sensor A 5 and the temperature sensor B 15 by the industrial personal computer 38 to monitor the heat dissipation of the magnetofluid pump in real time. Controlling the external circuit to heat the IGBT chip A 8, the IGBT chip B 22 and the IGBT chip C 24, observing the temperature of the chips by the thermal imager 36, and heating the chips to a certain temperature.

Step 2: controlling the external circuit by the industrial personal computer 38 to supply power to the positive electrode A 18, the negative electrode A 19, the negative electrode B 39 and the positive electrode B 40, and driving the liquid metal to flow for heat dissipation by the Lorentz forces generated under the action of the electric fields and the magnetic fields. Controlling the flow rate of the liquid metal by controlling the voltage of the two pairs of electrodes. Acquiring the surface temperature of the IGBT chip A 8, the IGBT chip B 22 and the IGBT chip C 24 by the thermal imager 36, and uploading the temperature information to the industrial personal computer 38 for data processing.

Step 3: analyzing the heat dissipation effect of the magnetofluid pump device by comparing the temperature changes of the IGBT chip A 8, the IGBT chip B 22 and the IGBT chip C 24 before and after heat dissipation. Judging whether a test is completed; if the test is not completed, continuing to control the external circuit to heat the IGBT chip A 8, the IGBT chip B 22 and the IGBT chip C 24 to another temperature or adjusting the voltage of the electrodes to control the flow rate of the liquid metal. If the test is completed, stopping and shutting down the system.

The liquid metal is a GaInSn alloy material, which comprises 68% of Ga, 22% of In and 10% of Sn by mass percentage. The material has a density of 6400 kg/m³, an electrical conductivity of $3.46\times10^6$ S/m and a thermal conductivity of 16.5 W/(m° C.), and has better thermal conductivity than water.

The technical solution of the present invention has the following advantages:

(1) The magnetofluid pump device for IGBT heat dissipation proposed by the present invention has a better heat dissipation effect than an ordinary water-cooling device. GaInSn liquid metal is used as a coolant, which can absorb more heat than water and better dissipate heat for IGBT chips.

(2) In the magnetofluid pump device for IGBT heat dissipation proposed by the present invention, temperature and pressure changes in the inlet pipe and outlet pipe of the magnetofluid pump can be monitored in real time by temperature sensors and pressure sensors, and the heat dissipation effect of the IGBT chips can be monitored in real time by the thermal imager.

(3) The test method for the magnetofluid pump device for IGBT heat dissipation proposed by the present invention is simple and easy to implement. The liquid metal can be driven to flow by energizing the positive and negative electrodes in the magnetofluid pump under the action of the magnetic fields, and water-cooling equipment can dissipate heat for the liquid metal in the magnetofluid pump. The test method proposed by the present invention can be used to test the heat dissipation effect of a magnetic fluid at different flow rates on IGBT chips when the IGBT is at different temperatures.

In the figures: 1 magnetofluid pump water inlet pipe; 2 magnetofluid pump lower shell; 3 magnetofluid pump pipe; 4 pressure sensor A; 5 temperature sensor A; 6 connecting bolt A; 7 magnetofluid pump upper shell; 8 IGBT chip A; 9 magnet S pole A; 10 magnet N pole A; 11 magnet S pole B; 12 magnet N pole B; 13 connecting bolt B; 14 pressure sensor B; 15 temperature sensor B; 16 magnetofluid pump water outlet pipe; 17 water-cooling equipment; 18 positive electrode A; 19 negative electrode A; 20 annular seal ring; 21 connecting bolt C; 22 IGBT chip B; 23 IGBT bottom plate; 24 IGBT chip C; 25 connecting bolt D; 26 connecting bolt E; 27 connecting bolt F; 28 connecting bolt G; 29 connecting bolt H; 30 connecting bolt I; 31 connecting bolt J; 32 connecting bolt K; 33 connecting bolt L; 34 temperature sensor A base; 35 pressure sensor A base; 36 thermal imager; 37 power supply circuit; 38 industrial personal computer; 39 negative electrode B; and 40 positive electrode B.

DETAILED DESCRIPTION

The present invention will be described in detail below in combination with the drawings.

Figure 1:
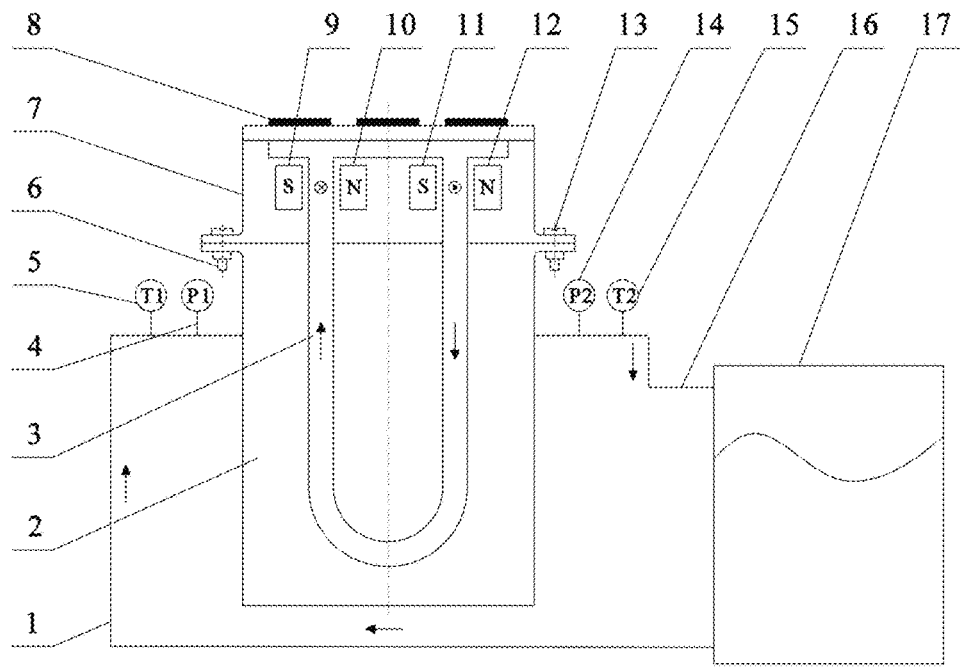
FIG. 1 General structural diagram of magnetofluid pump device.
Figure 2:
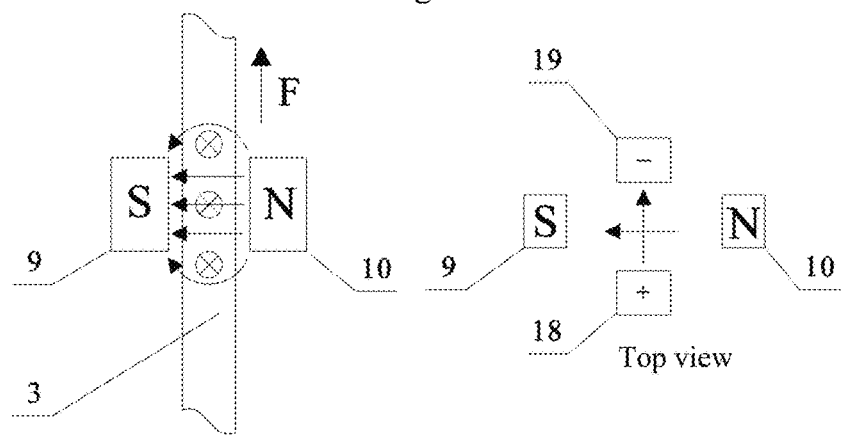
FIG. 2 Principle diagram of liquid metal flow.
Figure 2:
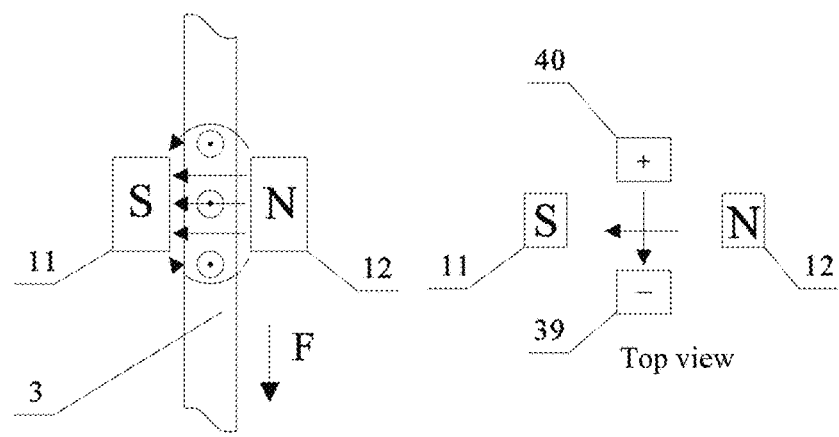
Figure 3:
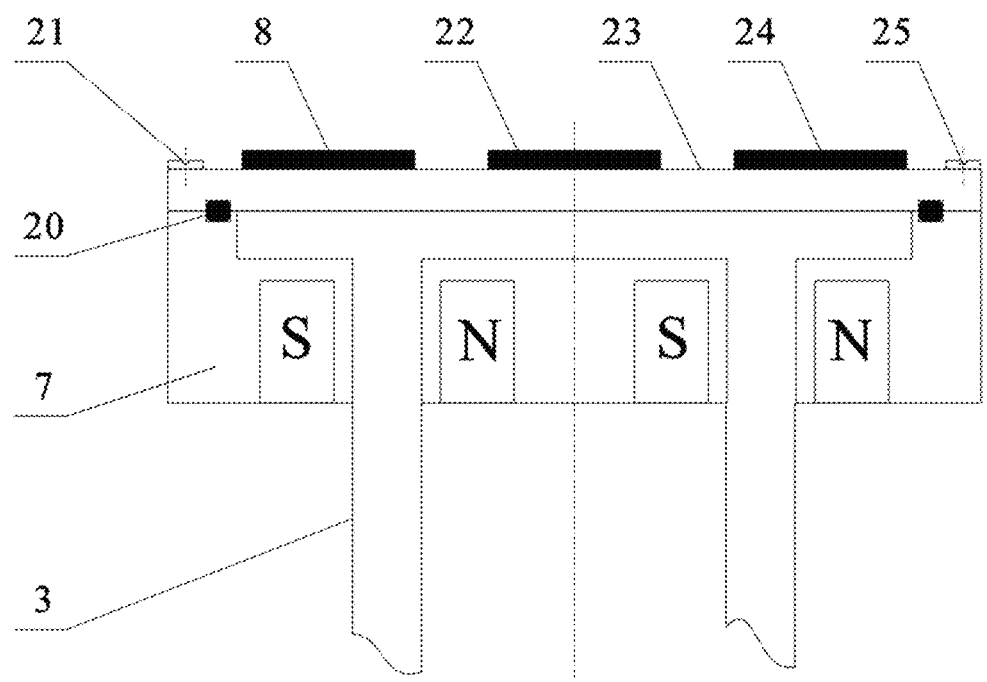
FIG. 3 Schematic diagram of connection between magnetofluid pump upper shell and IGBT bottom plate.

General structure of the magnetofluid pump device is shown in FIG. 1, FIG. 2 and FIG. 3; the IGBT chipset comprises an IGBT chip A 8, an IGBT chip B 22, an IGBT chip C 24 and an IGBT bottom plate 23; and the magnetofluid pump comprises a magnetofluid pump upper shell 7, a magnetofluid pump lower shell 2, a magnetofluid pump pipe 3, a magnet S pole A 9, a magnet N pole A 10, a magnet S pole B 11, a magnet N pole B 12, a positive electrode A 18, a negative electrode A 19, a negative electrode B 39 and a positive electrode B 40. The IGBT chipset is arranged on the magnetofluid pump; the magnetofluid pump is connected with a water-cooling equipment 17 by a magnetofluid pump water inlet pipe 1 and a magnetofluid pump water outlet pipe 16; and the magnetofluid pump upper shell 7 is connected with the magnetofluid pump lower shell 2 by a connecting bolt A 6 and a connecting bolt B 13.

Principle of liquid metal flow is shown in FIG. 2; a magnetic field is generated by the magnet S pole A 9 and the magnet N pole A 10, an electric field is generated by the positive electrode 18 and the negative electrode 19; a Lorentz force will be generated when the liquid metal is under the co-action of the electric field and the magnetic field, and the direction of the Lorentz force is upward according to the left-hand rule, so that the liquid metal will move upwards. Similarly, a downward Lorentz force will be generated under the action of a magnetic field generated by the magnet S pole B 11 and the magnet N pole B 12 and an electric field generated by the negative electrode B 39 and the positive electrode B 40, so that the liquid metal will move downwards.

Figure 4:
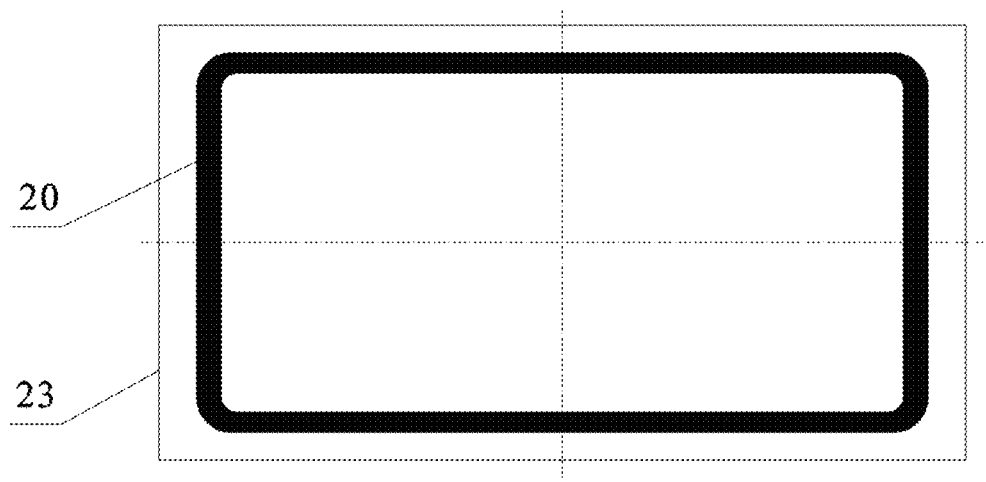
FIG. 4 Schematic diagram of sealing between magnetofluid pump upper shell and annular seal ring.

Schematic diagram of connection between the magnetofluid pump upper shell 7 and the IGBT bottom plate 23 is shown in FIG. 3 and FIG. 4; the IGBT chip A 8, the IGBT chip B 22 and the IGBT chip C 24 are welded on the IGBT bottom plate 23 by tin solder; an annular groove is formed between the IGBT bottom plate 23 and the magnetofluid pump upper shell 7, an annular seal ring 20 is arranged in the annular groove and used for sealing, and the IGBT bottom plate 23 and the magnetofluid pump upper shell 7 are connected by a connecting bolt C 21 and a connecting bolt D 25; and the magnetofluid pump pipe 3 is connected with the magnetofluid pump upper shell 7 by threads.

Figure 5:
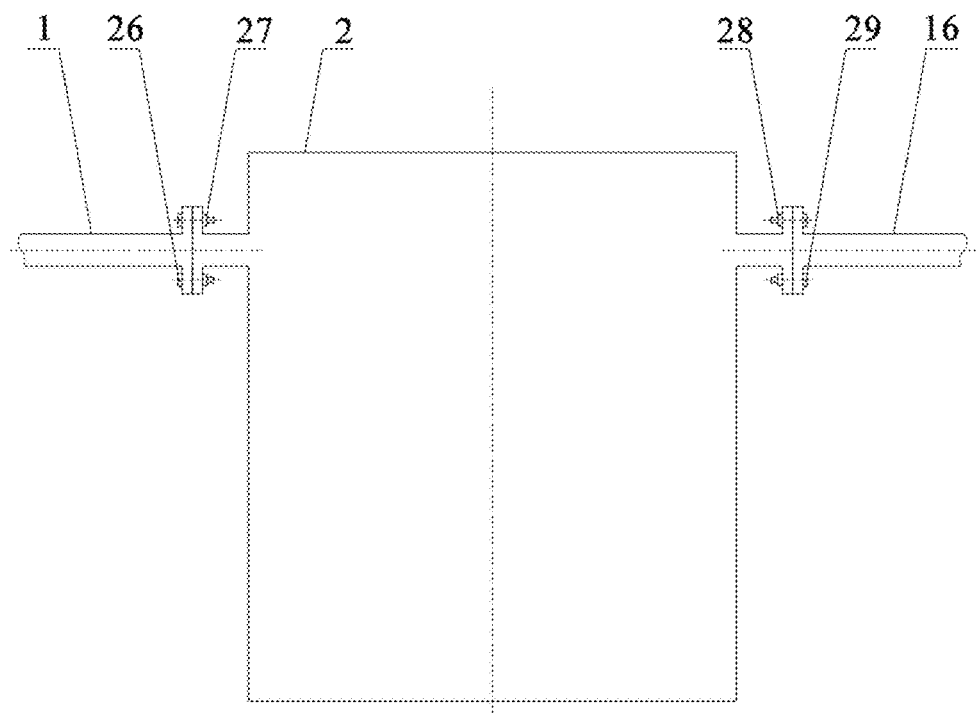
FIG. 5 Schematic diagram of connection of magnetofluid pump lower shell with water inlet pipe and water outlet pipe.

Schematic diagram of connection of the magnetofluid pump lower shell 2 with the magnetofluid pump water inlet pipe 1 and the magnetofluid pump water outlet pipe 16 is shown in FIG. 5; the magnetofluid pump water inlet pipe 1 is connected with the magnetofluid pump lower shell 2 by flanges and fastened by a connecting bolt E 26 and a connecting bolt F 27; the magnetofluid pump water outlet pipe 16 is connected with the magnetofluid pump lower shell 2 by flanges and fastened by a connecting bolt G 28 and a connecting bolt H 29; and connecting parts of the flanges are all provided with seal rings for end face sealing.

Figure 6:
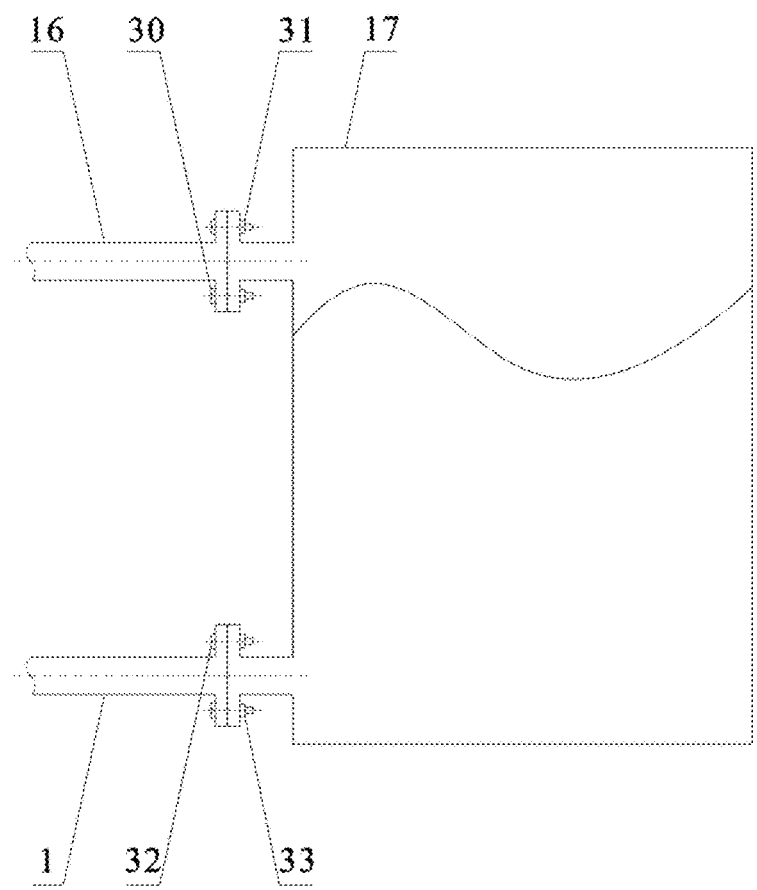
FIG. 6 Schematic diagram of connection of water-cooling equipment with water inlet pipe and water outlet pipe.

Schematic diagram of connection of the water-cooling equipment 17 with the magnetofluid pump water inlet pipe 1 and the magnetofluid pump water outlet pipe 16 is shown in FIG. 6; the magnetofluid pump water outlet pipe 16 is connected with the water-cooling equipment 17 by flanges, and two flanges are fastened and connected by a connecting bolt I 30 and a connecting bolt J 31; the magnetofluid pump water inlet pipe 1 is also connected with the water-cooling equipment 17 by flanges, and two flanges are fastened and connected by a connecting bolt K 32 and a connecting bolt L 33; and the connecting parts of the flanges are all provided with seal rings for end face sealing.

Figure 7:
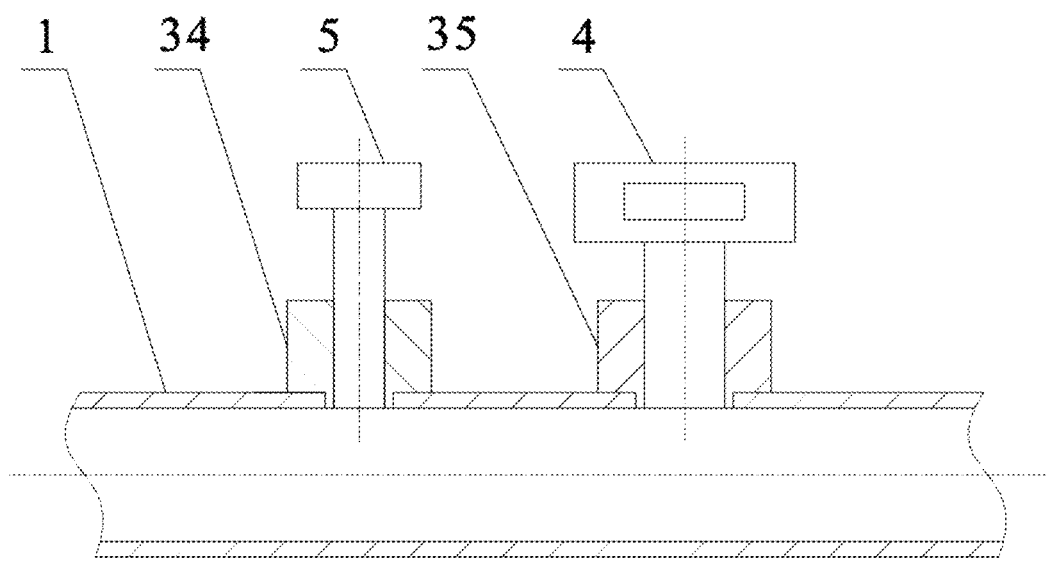
FIG. 7 Schematic diagram of installation of temperature sensor and pressure sensor on pipe.

Schematic diagram of connection of a temperature sensor A 5 and a pressure sensor A 4 with the magnetofluid pump water inlet pipe 1 is shown in FIG. 7; the temperature sensor A 5 is connected with a temperature sensor A base 34 by threads, and the temperature sensor A base 34 is connected with the magnetofluid pump water inlet pipe 1 by threads; the pressure sensor A 4 is connected with a pressure sensor A base 35 by threads, the pressure sensor A base 35 is connected with the magnetofluid pump water inlet pipe 1 by threads, and all connecting parts are provided with seal rings; and the installation method of a pressure sensor B 14 and a temperature sensor B 15 is the same.

Figure 8:
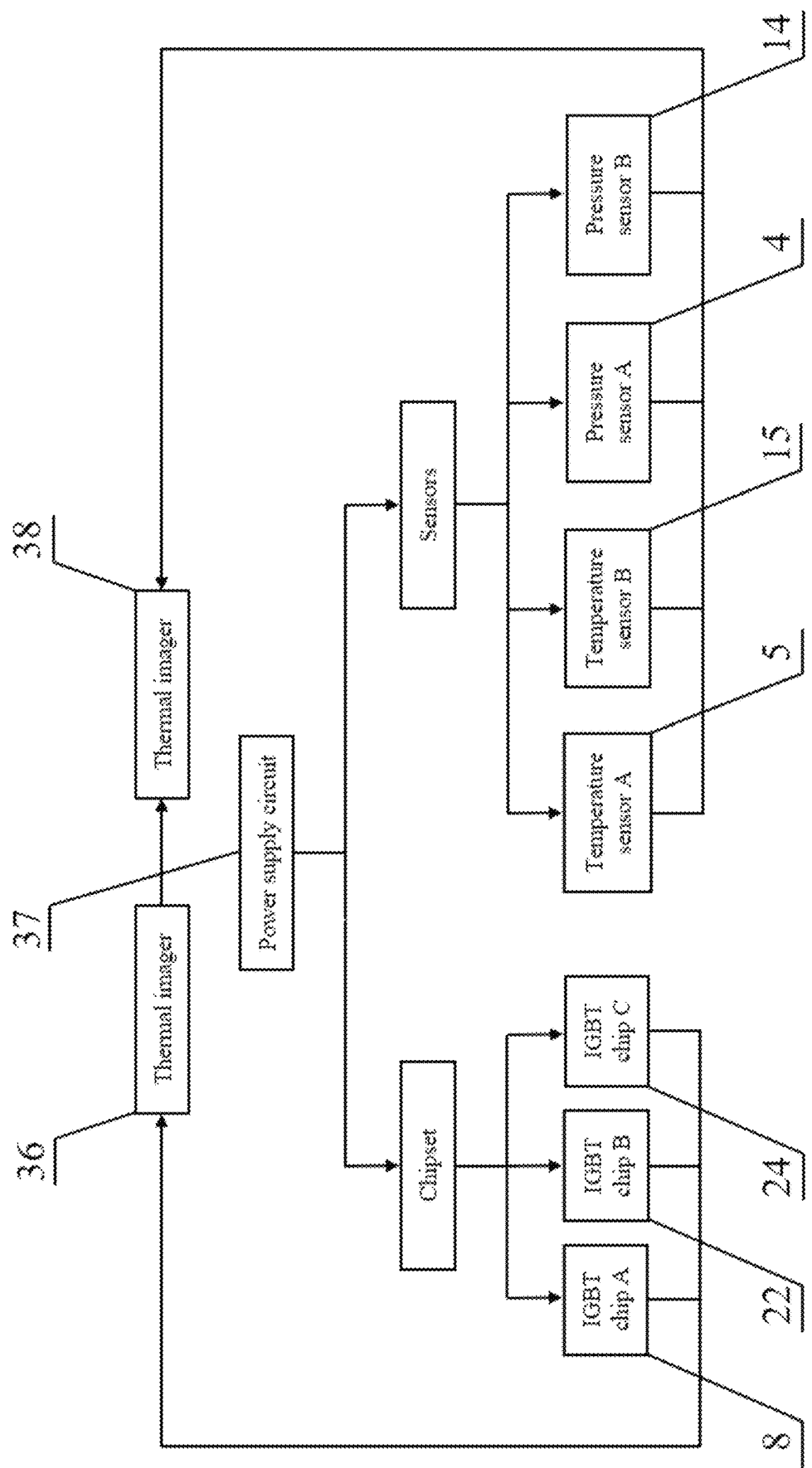
FIG. 8 Diagram of signal flow direction of magnetofluid pump device for IGBT heat dissipation.

Signal flow direction of the magnetofluid pump device for IGBT heat dissipation is shown in FIG. 8; power is supplied by a power supply circuit to the IGBT chip A 8, the IGBT chip B 22, the IGBT chip C 24, the temperature sensor A 5, the temperature sensor B 15, the pressure sensor A 4 and the pressure sensor B 14; the temperature information of the IGBT chip A 8, the IGBT chip B 22 and the IGBT chip C 24 is acquired by a thermal imager 36 and sent to an industrial personal computer 38; and the data information of the temperature sensor A 5, the temperature sensor B 15, the pressure sensor A 4 and the pressure sensor B 14 is directly sent to the industrial personal computer 38 for processing.

Figure 9:
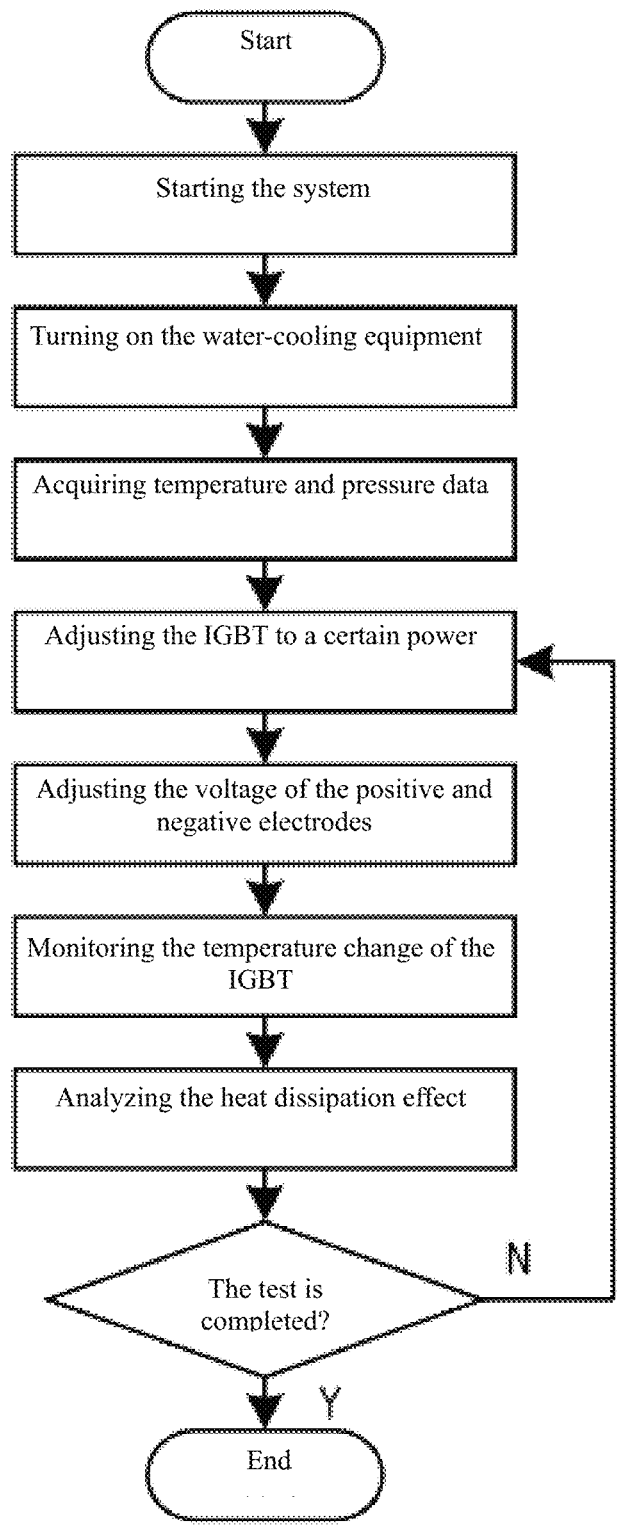
FIG. 9 Flow chart of test method for magnetofluid pump device for IGBT heat dissipation.

Flow chart of the test method for the magnetofluid pump device for IGBT heat dissipation is shown in FIG. 9; first, the system is started, the water-cooling equipment 17 is turned on, the pressure is adjusted to 0.1 MPa, and the flow is adjusted to 0.5 m$^3$/min; and the data information of the pressure sensor A 4, the pressure sensor B 14, the temperature sensor A 5 and the temperature sensor B 15 is acquired by the industrial personal computer 38. An external circuit is controlled to heat the IGBT chip A 8, the IGBT chip B 22 and the IGBT chip C 24 to 80° C., and the heating temperature is fed back by the thermal imager 36. The external circuit is controlled by the industrial personal computer 38 to adjust the voltage of the positive electrode 18, the negative electrode 19, the negative electrode 39 and the positive electrode 40 to 12 V, and the liquid metal is driven to flow for heat dissipation. The surface temperature of the IGBT chip A 8, the IGBT chip B 22 and the IGBT chip C 24 is acquired by the thermal imager 36, and uploaded to the industrial personal computer 38 for processing. The heat dissipation effect of the magnetofluid pump device is analyzed by comparing the temperature changes of the IGBT chip A 8, the IGBT chip B 22 and the IGBT chip C 24 before and after heat dissipation. Whether a test is completed is judged; if the test is not completed, the external circuit is continued to be controlled to heat the IGBT chip A 8, the IGBT chip B 22 and the IGBT chip C 24 to 100° C., or the voltage of the electrodes is adjusted to 24 V to change the flow rate of the liquid metal and continue the test. If the test is completed, the system is stopped and shut down.

This description is merely the enumeration of the implementation forms of the inventive concept. The protection scope of the present invention shall not be limited to the specific forms described in the embodiments, but shall also involve the equivalent technical means that can be contemplated by those skilled in the art according to the inventive concept.

The invention claimed is:

1. A magnetofluid pump device for IGBT heat dissipation, wherein the magnetofluid pump device is used to dissipate heat for a IGBT chipset; the IGBT chipset comprises an IGBT chip A, an IGBT chip B, an IGBT chip C and an IGBT bottom plate; the IGBT chip A, the IGBT chip B and the IGBT chip C are welded on the IGBT bottom plate by tin solder; the IGBT chipset is arranged on a magnetofluid pump; and the magnetofluid pump device comprises the magnetofluid pump, a water-cooling device, pressure measuring devices, temperature measuring devices and a data acquisition system;

the inner part of the magnetofluid pump is provided with a liquid metal, and the magnetofluid pump comprises a magnetofluid pump upper shell, a magnetofluid pump lower shell, a magnetofluid pump pipe in the upper and lower shells, as well as a magnet S pole A, a magnet N pole A, a magnet S pole B and a magnet N pole B which are arranged in order from left to right in the magnetofluid pump upper shell; the front face of the magnetofluid pump upper shell is provided with a positive electrode and a negative electrode, and the back face of the magnetofluid pump upper shell is provided with a negative electrode and a positive electrode; the magnetofluid pump upper shell is connected with the magnetofluid pump lower shell below by connecting bolts, and is connected with the IGBT bottom plate above by connecting bolts; the magnetofluid pump lower shell is connected with the water-cooling device by a magnetofluid pump water inlet pipe and a magnetofluid pump water outlet pipe, wherein the magnetofluid pump water outlet pipe is connected with the magnetofluid pump lower shell by flanges, and the magnetofluid pump water inlet pipe is connected with the magnetofluid pump lower shell by flanges; the magnetofluid pump pipe is connected with the magnetofluid pump upper shell by threads; a magnetic field is generated by the magnet S pole A and the magnet N pole A, an electric field is generated by the positive electrode and the negative electrode, and the liquid metal moves upwards under the co-action of the electric field and the magnetic field; similarly, under the action of a magnetic field generated by the magnet S pole B and the magnet N pole B and an electric field generated by the negative electrode and the positive electrode, the liquid metal moves downwards;

the water-cooling device is a piece of water-cooling equipment, which is used to dissipate heat for the liquid metal in the magnetofluid pump; water-cooling equipment is connected with the magnetofluid pump water inlet pipe and the magnetofluid pump water outlet pipe both by flanges;

the pressure measuring devices are a pressure sensor A and a pressure sensor B, which are respectively arranged on the magnetofluid pump water inlet pipe and the magnetofluid pump water outlet pipe, and are used to measure the pressure in the magnetofluid pump water inlet pipe and the magnetofluid pump water outlet pipe;

the temperature measuring devices are a temperature sensor A, a temperature sensor B and a thermal imager, which are respectively arranged on the magnetofluid pump water inlet pipe, the magnetofluid pump water outlet pipe and the IGBT chipset, and are used to measure the temperature of the magnetofluid pump water inlet pipe, the magnetofluid pump water outlet pipe and the IGBT chipset; and the data acquisition system is an industrial personal computer, is used to control an external circuit to heat the IGBT chip A, the IGBT chip B and the IGBT chip C to a certain temperature and acquire the data information of the pressure sensor A, the pressure sensor B, the temperature sensor A, the temperature sensor B and the thermal imager, and is electrically connected with each sensor.

2. The magnetofluid pump device for IGBT heat dissipation according to claim 1, wherein an annular groove is formed between the magnetofluid pump upper shell and the IGBT bottom plate, and an annular seal ring is arranged in the annular groove and used for sealing.

3. The magnetofluid pump device for IGBT heat dissipation according to claim 1, wherein connecting parts of the flanges are all provided with seal rings for end face sealing.

4. The magnetofluid pump device for IGBT heat dissipation according to claim 1, wherein thermal imager is 30 cm away from the IGBT chip A, the IGBT chip B and the IGBT chip C, and is used to measure the temperature changes of the chips.

5. The magnetofluid pump device for IGBT heat dissipation according to claim 1, wherein the liquid metal is a GaInSn alloy material, which comprises 68% of Ga, 22% of In and 10% of Sn by mass percentage.

6. A test method for the magnetofluid pump device for IGBT heat dissipation according to claim 1, comprising the following steps:

step 1: starting the system, turning on the water-cooling equipment, and adjusting appropriate flow and pressure to dissipate heat for the magnetofluid pump; acquiring the data information of the pressure sensor A, the pressure sensor B, the temperature sensor A and the temperature sensor B by the industrial personal computer to monitor the heat dissipation of the magnetofluid pump in real time; controlling the external circuit to heat the IGBT chip A, the IGBT chip B and the IGBT chip C, observing the temperature of the chips by the thermal imager and heating the chips to a certain temperature;

step 2: controlling the external circuit by the industrial personal computer to supply power to the positive electrode, the negative electrode, the negative electrode and the positive electrode, and driving the liquid metal to flow for heat dissipation by Lorentz forces; controlling the flow rate of the liquid metal by controlling the voltage of the two pairs of electrodes; acquiring the surface temperature of the IGBT chip A, the IGBT chip B and the IGBT chip C by the thermal imager, and uploading the temperature information to the industrial personal computer for data processing; and step 3: analyzing the heat dissipation effect of the magnetofluid pump device by comparing the temperature changes of the IGBT chip A, the IGBT chip B and the IGBT chip C before and after heat dissipation; judging whether a test is completed; if the test is not completed, continuing to control the external circuit to heat the IGBT chip A, the IGBT chip B and the IGBT chip C to another temperature or adjusting the voltage of the electrodes to control the flow rate of the liquid metal; if the test is completed, stopping and shutting down the system.

* * * * *